(12) United States Patent
Yun et al.

(10) Patent No.: US 10,079,581 B2
(45) Date of Patent: Sep. 18, 2018

(54) RECEIVER AND OPERATING METHOD THEREOF

(71) Applicant: SAMSUNG ELECTRONICS CO., LTD., Suwon-si (KR)

(72) Inventors: Seok Ju Yun, Hwaseong-si (KR); Seongjoong Kim, Hwaseong-si (KR); Yongkyu Kim, Hwaseong-si (KR); Young Jun Hong, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 32 days.

(21) Appl. No.: 15/162,677

(22) Filed: May 24, 2016

(65) Prior Publication Data

US 2017/0117862 A1 Apr. 27, 2017

(30) Foreign Application Priority Data

Oct. 21, 2015 (KR) .................. 10-2015-0146775

(51) Int. Cl.
| | |
|---|---|
| *H04B 1/06* | (2006.01) |
| *H03G 3/30* | (2006.01) |
| *H03B 5/12* | (2006.01) |
| *H03F 3/19* | (2006.01) |
| *H03F 3/26* | (2006.01) |

(52) U.S. Cl.
CPC .......... *H03G 3/3036* (2013.01); *H03B 5/1228* (2013.01); *H03F 3/19* (2013.01); *H03F 3/265* (2013.01); *H03G 3/3052* (2013.01); *H03F 2200/102* (2013.01); *H03F 2200/294* (2013.01); *H03F 2200/451* (2013.01)

(58) Field of Classification Search
CPC .......... H04B 1/16; H04B 1/04; H04B 1/1638; H04B 1/109; H04B 1/0475; H04B 1/525; H04B 2001/0425; H04B 1/26; H04B 15/02; H04B 17/101; H04B 17/11; H04B 17/309; H04B 1/0057; H04B 1/006; H04B 1/0075; H04B 1/0466; H04B 1/027
USPC .......................................... 455/234.1
See application file for complete search history.

(56) References Cited

U.S. PATENT DOCUMENTS

| | | | |
|---|---|---|---|
| 6,389,275 B1 | 5/2002 | Kawashima et al. | |
| 8,150,361 B2 | 4/2012 | Hallivuori et al. | |
| 8,913,648 B2 | 12/2014 | Kang et al. | |
| 2004/0198288 A1* | 10/2004 | Sadowski | H03D 11/02 455/259 |

(Continued)

FOREIGN PATENT DOCUMENTS

| | | |
|---|---|---|
| JP | 2007-81708 A | 3/2007 |
| KR | 10-2014-0146688 A | 12/2014 |

OTHER PUBLICATIONS

N. Joehl et al. "A Low-Power 1-GHz Super-Regenerative Transceiver with Time-Shared PLL Control", IEEE Journal of Solid-State Circuits, vol. 36.7 (2001): 1025-1031.

(Continued)

*Primary Examiner* — Ajibola Akinyemi
(74) *Attorney, Agent, or Firm* — NSIP Law

(57) ABSTRACT

A receiver includes a low noise amplifier (LNA) configured to amplify an input RF signal using a first current supplied by a first current source, and a voltage controlled oscillator (VCO) for applying an oscillation frequency to the amplified signal by generating an oscillation signal using the first current.

16 Claims, 7 Drawing Sheets

(56) References Cited

U.S. PATENT DOCUMENTS

| | | | |
|---|---|---|---|
| 2005/0221790 A1* | 10/2005 | Persico | H04B 1/1615 |
| | | | 455/343.2 |
| 2006/0035619 A1* | 2/2006 | Hallivuori | H04B 1/18 |
| | | | 455/333 |
| 2006/0148437 A1* | 7/2006 | Krivokapic | H04W 52/0238 |
| | | | 455/232.1 |
| 2006/0160510 A1 | 7/2006 | Seppinen et al. | |
| 2009/0042527 A1 | 2/2009 | Niknejad | |
| 2009/0156158 A1 | 6/2009 | Kang et al. | |
| 2014/0093019 A1 | 4/2014 | Oehler et al. | |
| 2014/0273898 A1 | 9/2014 | Brown et al. | |
| 2015/0010120 A1 | 1/2015 | Yun et al. | |

OTHER PUBLICATIONS

Felix Omar Fernández-Rodríguez et al.. "Advanced Quenching Techniques for Super-Regenerative Radio Receivers", IEEE Transactions on Circuits and Systems I: Regular Papers, vol. 59.7 (2012): 1533-1545.

\* cited by examiner

RECEIVER AND OPERATING METHOD THEREOF

CROSS-REFERENCE TO RELATED APPLICATION

This application claims the benefit under 35 USC 119(a) of Korean Patent Application No. 10-2015-0146775, filed on Oct. 21, 2015, at the Korean Intellectual Property Office, the entire disclosure of which is incorporated herein by reference for all purposes.

BACKGROUND

1. Field

The following description relates to a super-regenerative receiver (SRR) method and apparatus, and more particularly, to an SRR method and apparatus to receive a wireless communication signal.

2. Description of Related Art

A super-regenerative receiver (SRR) typically has satisfactory reception sensitivity and low power consumption due to high radio frequency (RF) gain characteristics. Recently, wireless transceivers have started being used in Internet of Things (IoT) operating at low power. That is, when objects, including devices, vehicles, buildings and other items, are embedded with electronics, software, sensors, and network connectivity that enables or controls these objects to collect and exchange data, low-power performance may be extensively utilized. A super-regenerative oscillator (SRO) structure may be appropriate for a low power receiver.

However, an SRO receiver may have a relatively high total consumption power due to a voltage controlled oscillator (VCO) and a low noise amplifier (LNA) corresponding to an RF block of the SRO.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A receiver includes a low noise amplifier (LNA) configured to amplify an input RF signal using a first current supplied by a first current source, and a voltage controlled oscillator (VCO) for applying an oscillation frequency to the amplified signal by generating an oscillation signal using the first current.

The LNA may use the VCO as a load.

The receiver may be a super-regenerative receiver.

The receiver may further include a bleeding current source configured to generate a second current to be supplied to the LNA to amplify the input signal.

A total current supplied to the LNA may be a sum of the first current and the second current.

The VCO may include an LC resonator that is used to generate the oscillation signal. The receiver may further include a quench waveform controller configured to generate a first quench signal to control a switch electrically connected in parallel with the LC resonator and to generate a second quench signal, where the receiver is configured to apply the second quench signal to the bleeding current source.

The receiver may further include an energy detector (ED) configured to detect an envelope for a signal resulting from the applying of the oscillation frequency to the amplified signal; and an automatic gain controller (AGC) configured to control a magnitude of the second current based on the detected envelope.

The receiver may further include a current ratio controller (CRC) configured to control a ratio of a total current supplied to the VCO and a total current supplied to the LNA that are dependent on the first current.

The VCO may include an LC resonator comprising a first inductor and a first capacitor, and a first transistor and a second transistor corresponding to complementary transistors to perform the applying of the oscillation frequency to the amplified signal.

The first transistor may be a p-type metal-oxide-semiconductor field-effect transistor (p-MOSFET) and the second transistor is an n-type metal-oxide-semiconductor field-effect transistor (n-MOSFET).

A drain node of the first transistor may be electrically connected to a first end of the LC resonator. A gate node of the first transistor may electrically correspond to a first output node of the VCO. A drain node of the second transistor may be electrically connected to a second end of the LC resonator; and a gate node of the second transistor may electrically correspond to a second output node of the VCO.

A source node of either of the first transistor or the second transistor may be electrically provided results of the amplifying of the input RF signal by the LNA.

The VCO may further include a switch electrically connected in parallel to the LC resonator to implement super-regeneration in the receiver.

The receiver may further include a second inductor, a second capacitor, a third transistor of a same transistor type as the second transistor, and a fourth transistor of a same transistor type as the first transistor. A source node of the first transistor may be electrically connected to a first end of the second inductor and a first end of the second capacitor. A source node of the second transistor may be electrically connected to a second end of the second capacitor, a drain node of the third transistor, and a drain node of the fourth transistor. A source node of the fourth transistor may be electrically connected to a voltage source.

A receiver includes a voltage controlled oscillator (VCO) configured to generate a signal, the signal having an oscillation frequency, using a first current, a low noise amplifier (LNA) configured to amplify an input signal using a second current and a current ratio controller (CRC) configured to control a ratio of the first current and the second current.

The receiver may include a first current source configured to generate the first current. The receiver may be configured so the second current results from interaction of the first current and another current from another current source.

The LNA may use the VCO as a load.

The receiver may further include a bleeding current source configured to generate a bleeding current. The receiver may be configured so the second current is a sum of the first current and the bleeding current.

The receiver may further include an energy detector (ED) configured to detect an envelope for a signal resulting from the applying of the oscillation frequency to the amplified signal, and an automatic gain controller (AGC) configured to control a magnitude of the second current based on the detected envelope.

Other features and aspects will be apparent from the following detailed description, the drawings, and the claims.

Figure 1:
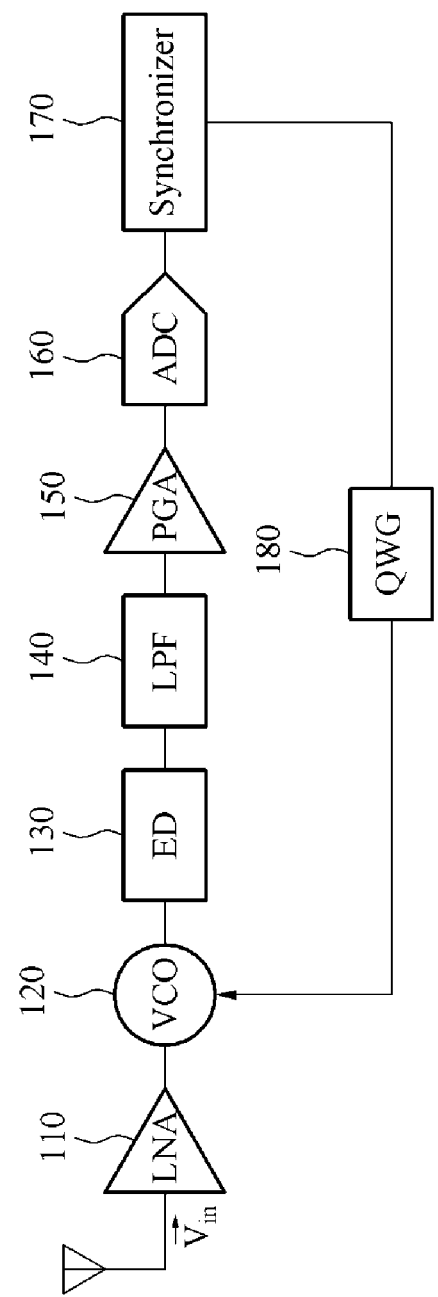
FIG. 1 is a block diagram illustrating a receiver portion of a receiver apparatus in accordance with an embodiment.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art after having a full understanding of the present disclosure. The sequences of operations described herein are merely examples, and are not limited to those set forth herein, but may be changed as will be apparent to one of ordinary skill in the art, with the exception of operations necessarily occurring in a certain order, after a full understanding of the present disclosure. Also, descriptions of constructions that are known to one of ordinary skill in the art, after full understanding of the present disclosure, may be omitted for increased clarity and conciseness.

The features described herein may be embodied in different forms, and are not to be construed as being limited to the examples described herein. Rather, the examples described herein have been provided so that this disclosure will be thorough and complete, and will convey a scope of the disclosure to one of ordinary skill in the art.

The terminology used herein is for the purpose of describing particular examples only and is not to be limiting of the examples. As used herein, the singular forms "a," "an," and "the" are intended to include the plural forms as well, unless the context clearly indicates otherwise. It will be further understood that the terms "include/comprise" and/or "have" when used in this specification, specify the presence of stated features, integers, steps, operations, elements, components, and/or combinations thereof, but do not preclude the presence or addition of one or more other features, numbers, steps, operations, elements, components, and/or groups thereof.

Unless otherwise defined, all terms including technical and scientific terms used herein have the same meaning as commonly understood by one of ordinary skill in the art to which examples belong, after a full understanding of the present disclosure. It will be further understood that terms, such as those defined in commonly-used dictionaries, should be interpreted as having a meaning that is consistent with their meaning in the context of the relevant art and the present disclosure and will not be interpreted in an idealized or overly formal sense unless expressly so defined herein.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

When describing examples with reference to the accompanying drawings, like reference numerals refer to like constituent elements and a repeated description related thereto will be omitted. When it is determined detailed description related to a related configuration they may make the purpose of the examples unnecessarily ambiguous in describing the examples, the detailed description will be omitted here.

FIG. 1 is a block diagram illustrating a receiver portion of a receiver apparatus in accordance with an embodiment. The receiver apparatus includes a low noise amplifier (LNA) 110 and a voltage controlled oscillator (VCO) 120. The receiver also includes an energy detector (ED) 130, a low pass filter (LPF) 140, a programmable gain amplifier (PGA) 150, an analogue-digital converter (ADC) 160, a synchronizer 170, and a quench waveform generator (QWG) 180, for example. The block diagram of FIG. 1 briefly describes a receiver portion of a receiver apparatus is illustrated in brief for ease of description, and noting that the receiver apparatus additionally or alternatively may include portions of the components.

The VCO may be configured to control an oscillation based on a signal transmitted from the LNA 110. Each of the LNA 110 and the VCO 120 may include an additional current source (not shown). Each of the LNA 110 and the VCO 120 may be parts of different power transmission paths, but is not necessarily limited thereto. Typically, power consumption of the LNA 110 and/or power consumption of the VCO 120 may be large, in proportion to the total power consumption of the entire receiver apparatus or even of the remaining ED 130, LPF 140, PGA 150, ADC 160 and/or synchronizer 170.

To secure stable performance in a super-regenerative oscillator (SRO) structure, a quench signal may be applied in response to a current supplied to the VCO 120. The quench signal may be generated by the QWG 180.

In response to a frequency difference between a signal generated by the VCO 120 and a frequency of a radio frequency (RF) input signal e.g., a received RF signal, being relatively small, degradation in reception sensitivity by a leakage current may occur. In terms of an SRO receiver, a frequency selectivity characteristic may be approximate to a Q factor value of an LC tank of the VCO 120. In other words, the frequency selectivity characteristic of the SRO receiver may be deficient.

Energy detector (ED) 130 may include an envelope detector configured to receive the oscillated signal generated by VCO 120. Energy detector 130 may output an envelope signal, which is a rectified envelope of the oscillated signal generated by VCO 120.

Figure 2:
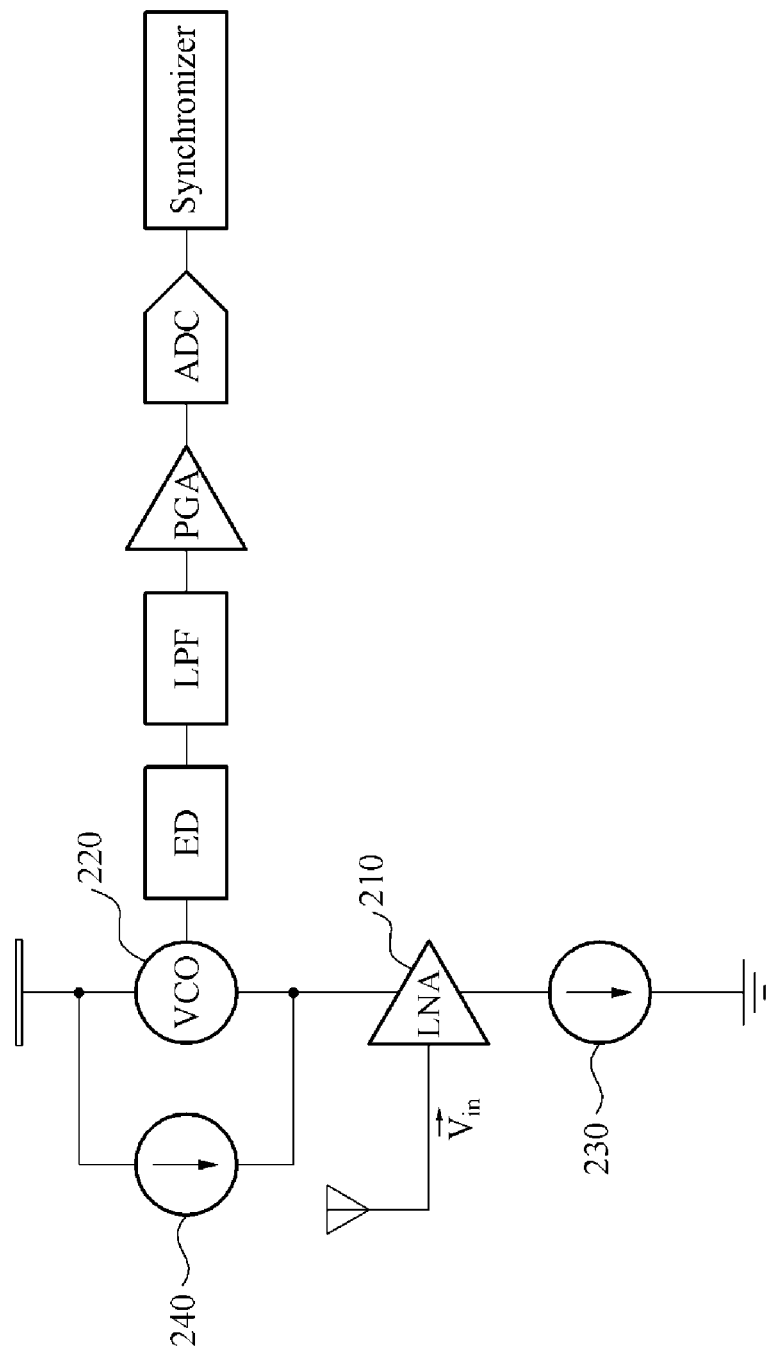
FIG. 2 is a block diagram illustrating a receiver portion of a receiver apparatus in accordance with an embodiment.

FIG. 2 is a block diagram illustrating a receiver portion of a receiver apparatus in accordance with an embodiment. The receiver apparatus includes a low noise amplifier (LNA) 210 and a voltage controlled oscillator (VCO) 220. The receiver apparatus also includes a first current source 230 and a bleeding current source 240. Some receiver components illustrated in FIG. 2 may have similar structure and characteristics to those described above with reference to FIG. 1. For ease of description, and to avoid redundancy, descriptions of such components may be omitted below.

As shown in FIG. 2, LNA 210 and the VCO 220 share the first current source 230. The LNA 210 and the VCO 220 may be stacked in a block, and thereby may be disposed in a same power transmission path. If this structure is used, the LNA 210 may use the VCO 220 as a load such that a current used in the VCO 220 may also be used in the LNA 210. For example, a first current generated by the first current source 230 may be used by the VCO 220 and may also be used by the LNA 210.

Since part of the current is used by the VCO 220 and then may also be used by the LNA 210 in a radio frequency (RF) block, the receiver of FIG. 2 may have a structure of lower power consumption than a super-regenerative oscillator (SRO) structure that lacks this configuration. When LNA 210 and the VCO 220 correspond to blocks operating at high speed and consuming a great amount of power, the LNA 210 and the VCO 220 may effectively achieve low power consumption based on a scheme for reusing a current.

The receiver further includes the bleeding current source 240 configured to supply an additional current to the LNA 210. The bleeding current source 240 may generate the current used by the VCO 220 and a bleeding current to be supplied to the LNA 210. That is, the bleeding current source 240 may supply the current and the bleeding current to the LNA 210. For example, the bleeding current source 240 may generate the bleeding current based on a difference between a total current to be supplied to the LNA 210 and a total current to be supplied to the VCO 220. Here, as only an example, a current ILNA flowing in the LNA 210 may be expressed as shown below in Equation 1.

$$I_{LNA} = I_{VCO} + I_{BLE}$$ Equation 1:

In Equation 1, IVCO denotes a current flowing to the VCO 220, and IBLE denotes a bleeding current generated by the bleeding current source 240.

A frequency lock range with respect to an input signal of the receiver may be expressed as shown below in Equation 2, for example.

$$f_{lock} \approx \frac{\omega_o G_{LNA} \cdot V_{in}}{2QG_p \cdot V_{OSC}} = \frac{\omega_o (I_{VCO} + I_{BLE}) \cdot V_{in}}{QG_p \cdot V_{OSC} \cdot V_{OD}} = \frac{\omega_o V_{in}(1+k)}{QV_{OD}}$$ Equation 2

In Equation 2, Q denotes a value of a Q factor of an LC resonator in the VCO 220 and $\omega_o$ denotes an operation frequency. Each of $V_{in}$ and $V_{OSC}$ denote a voltage in a corresponding block, and $V_{OD}$ denotes an overdrive voltage of an input transistor of the LNA 210. Each of $G_{LNA}$ and $G_p$ denote a gain in a corresponding block.

In Equation 2, k denotes a ratio of the bleeding current to the current flowing in the VCO 220. Thus, k may be expressed as shown below in Equation 3, for example.

$$k = I_{VCO}/I_{BLE}$$ Equation 3:

Referring to Equation 2 and Equation 3 together, the frequency lock range is inversely proportional to a value of Q and the frequency lock range is proportional to a value of k. A frequency selectivity of the receiver may be improved according to an increase in the ratio of the bleeding current and the current flowing in the VCO 220. Accordingly, the ratio of the bleeding current to the current flowing in the VCO 220 may be controlled to optimize the frequency selectivity of the receiver.

Figure 3:
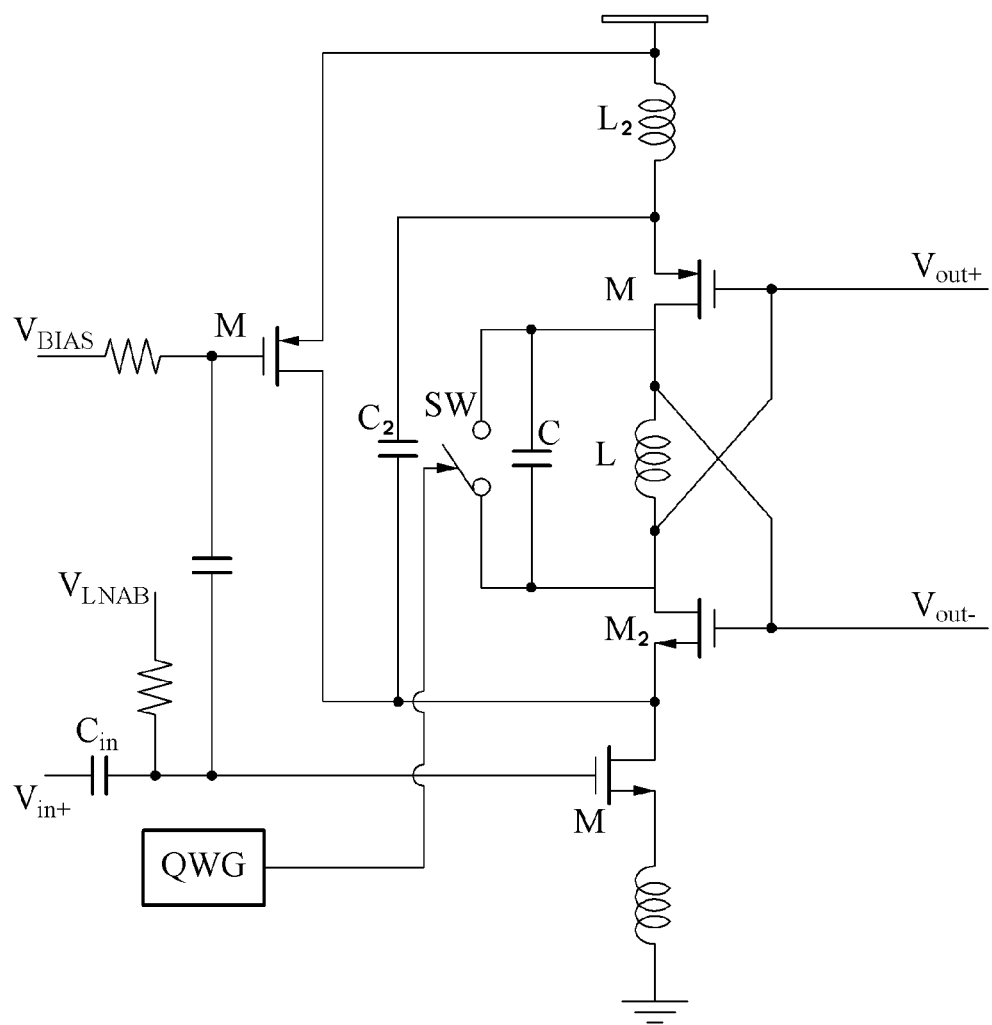
FIG. 3 is a circuit diagram illustrating a portion of a circuit of a radio frequency (RF) block of a receiver apparatus in accordance with an embodiment.

FIG. 3 is a circuit diagram illustrating a portion of a circuit of a radio frequency (RF) block of a receiver apparatus in accordance with an embodiment. For example, the circuit diagram illustrated in FIG. 3 may be used in the receiver apparatus of FIG. 2, however this is only an example.

Here, the receiver apparatus includes a complementary oscillator using a transistor M1 and a transistor M2 corresponding to different types of complementary transistors. For example, M1 may be a p-type metal-oxide-semiconductor field-effect transistor (p-MOSFET) and M2 may be an n-type metal-oxide-semiconductor field-effect transistor (n-MOSFET). The receiver also includes a transistor M3 as a low noise amplifier (LNA) to transmit an input signal to the complementary oscillator. In an example, the M3 may reuse a current used in the complementary oscillator. A bleeding current also supplied to the M3 may be transmitted by a transistor M4. M3 and M4 may correspond to different types of complementary transistors. For example, M3 may be an n-MOSFET and M4 may be a p-MOSFET. M4 may be included in a structure for transmitting the input signal, e.g., a received RF signal, to an amplifier such that a current of the M4 may also be used in M3.

As illustrated in FIG. 3, a current of an oscillator may also be used in the amplifier, thereby allowing for low power consumption. Additionally or alternatively, the complementary transistor may be used in the oscillator and the amplifier, thereby achieving low power consumption of a block. Based on such configurations, power consumption of the block may be effectively reduced.

Referring again to FIG. 3, the complementary oscillator includes an LC resonator including an inductor L1 and a capacitor C1. In an operation frequency, the capacitor C1 connects each source end of M1 and M2 in an AC condition, and separates each source end in a DC condition. An inductor L2 may prevent a loss of a signal. The complementary oscillator includes a switch SW connected in parallel with the LC resonator. In response to the switch SW being on, an LC oscillation is not generated. In response to the switch SW being off, the LC oscillation is generated. In an example, a quench signal generated in a quench waveform generator (QWG) may be applied to the complementary oscillator by controlling the switch SW. For example, the quench signal may be fed-back quench signal, such as illustrated in FIG. 1. In response to the quench signal being applied by controlling the switch SW connected in parallel to the LC resonator, a greater reduction of power consumption may be expected from this structure than from a super-regenerative oscillator (SRO) structure lacking this configuration.

Figure 4:
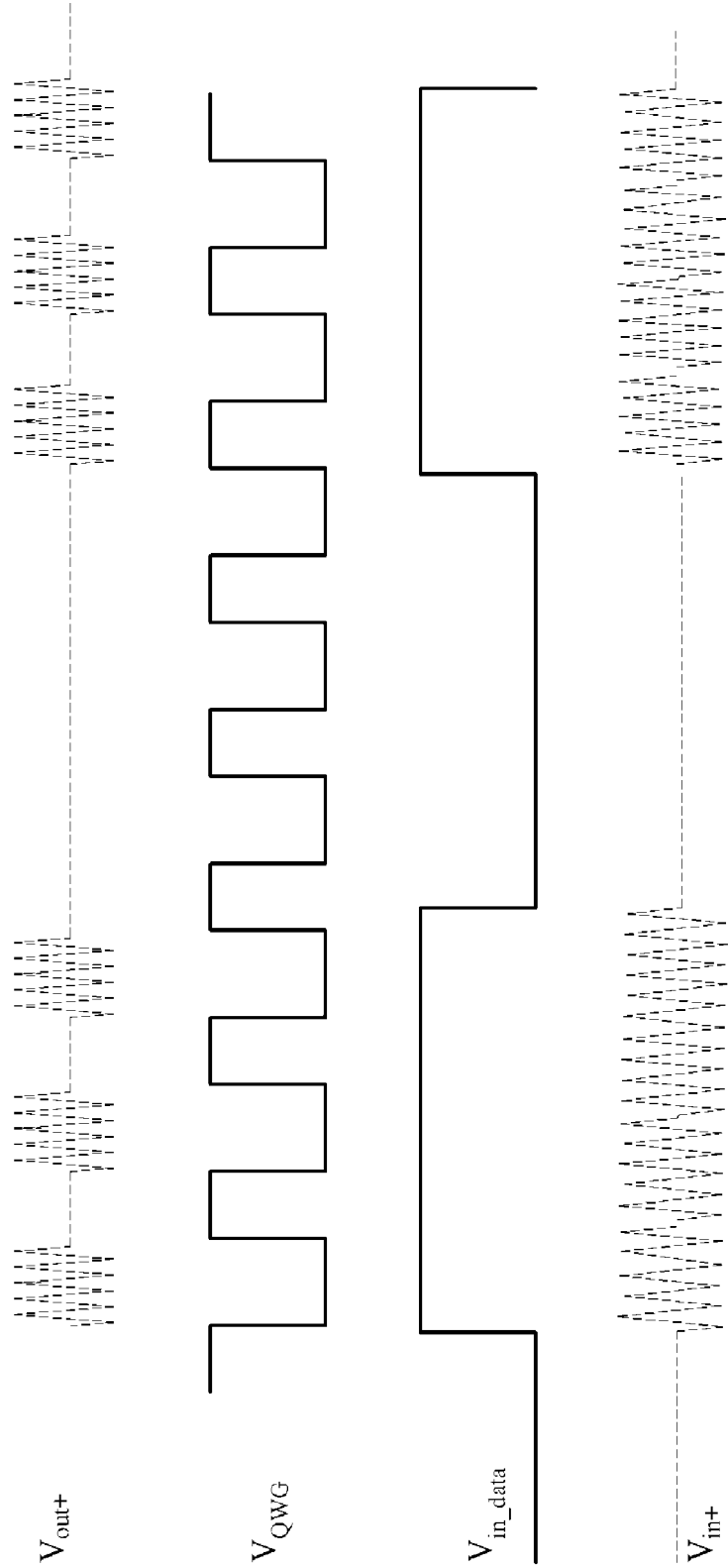
FIG. 4 is a circuit diagram illustrating a portion of a circuit of a receiver radio frequency (RF) block of a receiver apparatus in accordance with an embodiment.

FIG. 4 is a circuit diagram illustrating a portion of a circuit of a receiver radio frequency (RF) block of a receiver apparatus in accordance with an embodiment. In response to received data being Vin_data, an input signal may be expressed by Vin+. In response to a quench signal being applied to the oscillator, such as a quench signal VQWG, being applied to the oscillator, an output signal of the oscillator may be expressed by Vout+.

Figure 5:
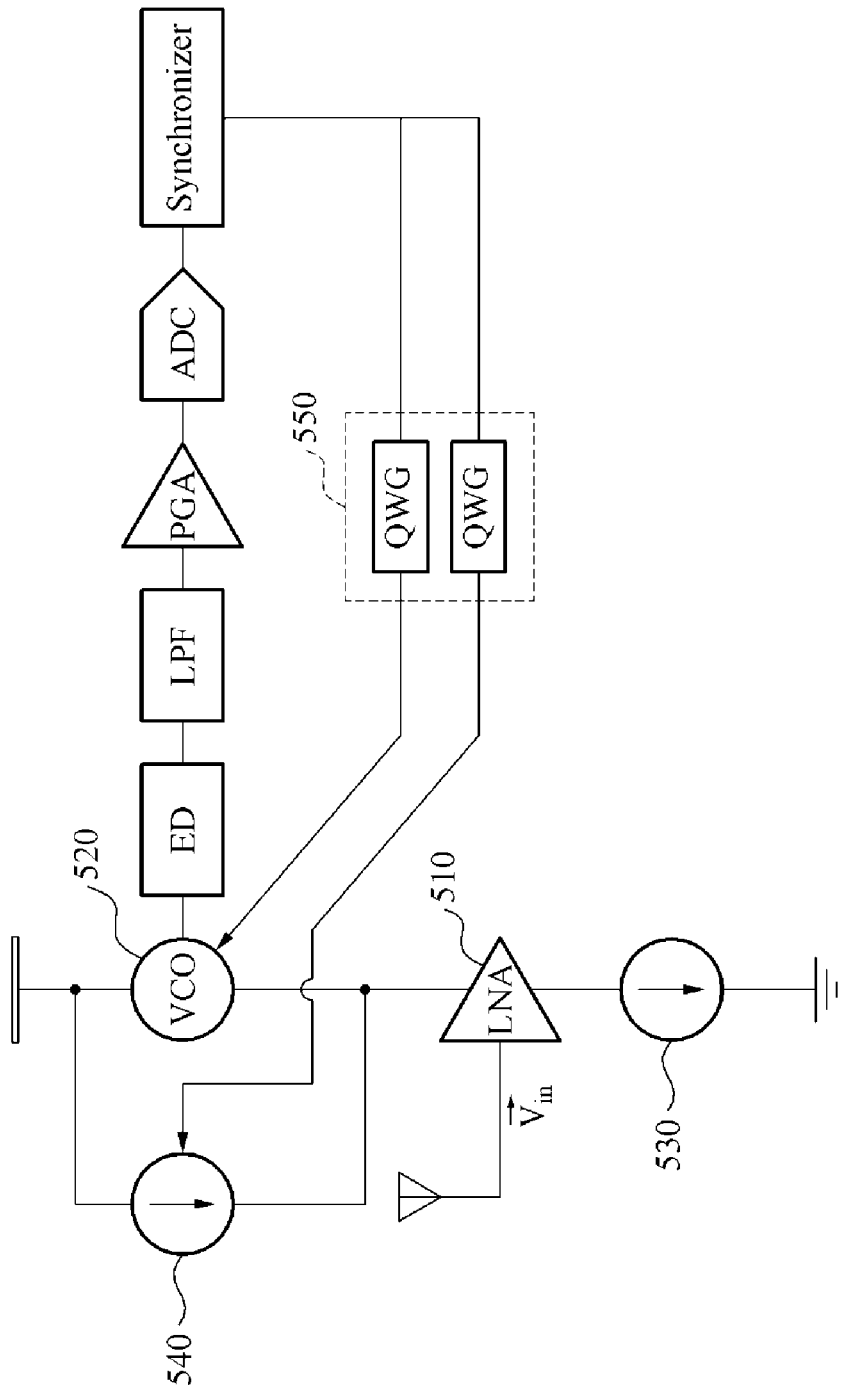
FIG. 5 is a block diagram illustrating a receiver portion of a receiver apparatus in accordance with an embodiment.

FIG. 5 is a block diagram illustrating a receiver portion of a receiver apparatus in accordance with an embodiment. The receiver may include a low noise amplifier (LNA) 510 and a voltage controlled oscillator (VCO) 520. The receiver may include a first current source 530, a bleeding current source 540, and a quench waveform controller 550. Some receiver components illustrated in FIG. 5 may have similar structure and characteristics to those described above with reference to FIG. 1. For ease of description, and to avoid redundancy, descriptions of such components may be omitted below.

The LNA 510 and the VCO 520 share the first current 530. The LNA 510 and the VCO 520 may be stacked in a block, and thereby may be disposed in a same power transmission path. If this structure is used, the LNA 510 may use the VCO 520 as a load such that a current used in the VCO 520 may also be used in the LNA 510. For example, a first current generated by the first current source 530 may be used by the VCO 520 and may also be used by the LNA 510.

The receiver further includes the bleeding current source 540 configured to supply an additional current to the LNA 510. The bleeding current source 540 may generate the current used by the VCO 520 and a bleeding current to be supplied to the LNA 510. That is, the bleeding current source 540 may supply the current passing through or used by the VCO 520 and the bleeding current to the LNA 510. For example, the bleeding current source 540 may generate the bleeding current based on a difference between a total current to be supplied to the LNA 510 and a total current to be supplied to the VCO 520.

The receiver further includes the quench waveform controller 550, which may be applicable to at least one of the VCO 520 and the bleeding current source 540. The quench waveform controller 550 may include a first quench waveform generator (QWG) to generate a first quench signal to be applied to the VCO 520 and a second QWG to generate a second quench signal to be applied to the bleeding current source 540.

The quench waveform controller 550 may synchronize a quench signal based on a signal received from the end unit of the receiver, for example, the synchronizer, by controlling a clock of a quench signal. The quench signal may be applied to both of the VCO 520 and the bleeding current source 540, thereby optimizing a ratio between a current of the LNA 510 and a total current to be supplied to the VCO 520 by controlling at least one of a duty cycle, an amplitude, and the clock of the quench signal. Utilizing this configuration, a frequency selectivity of the receiver may be improved through the quench waveform controller 550. In an example, an output quench signal of the quench waveform controller 550 to be input into the VCO 520 may be a signal to control the switch SW of FIG. 3, but this is merely an example and not limited thereto.

Figure 6:
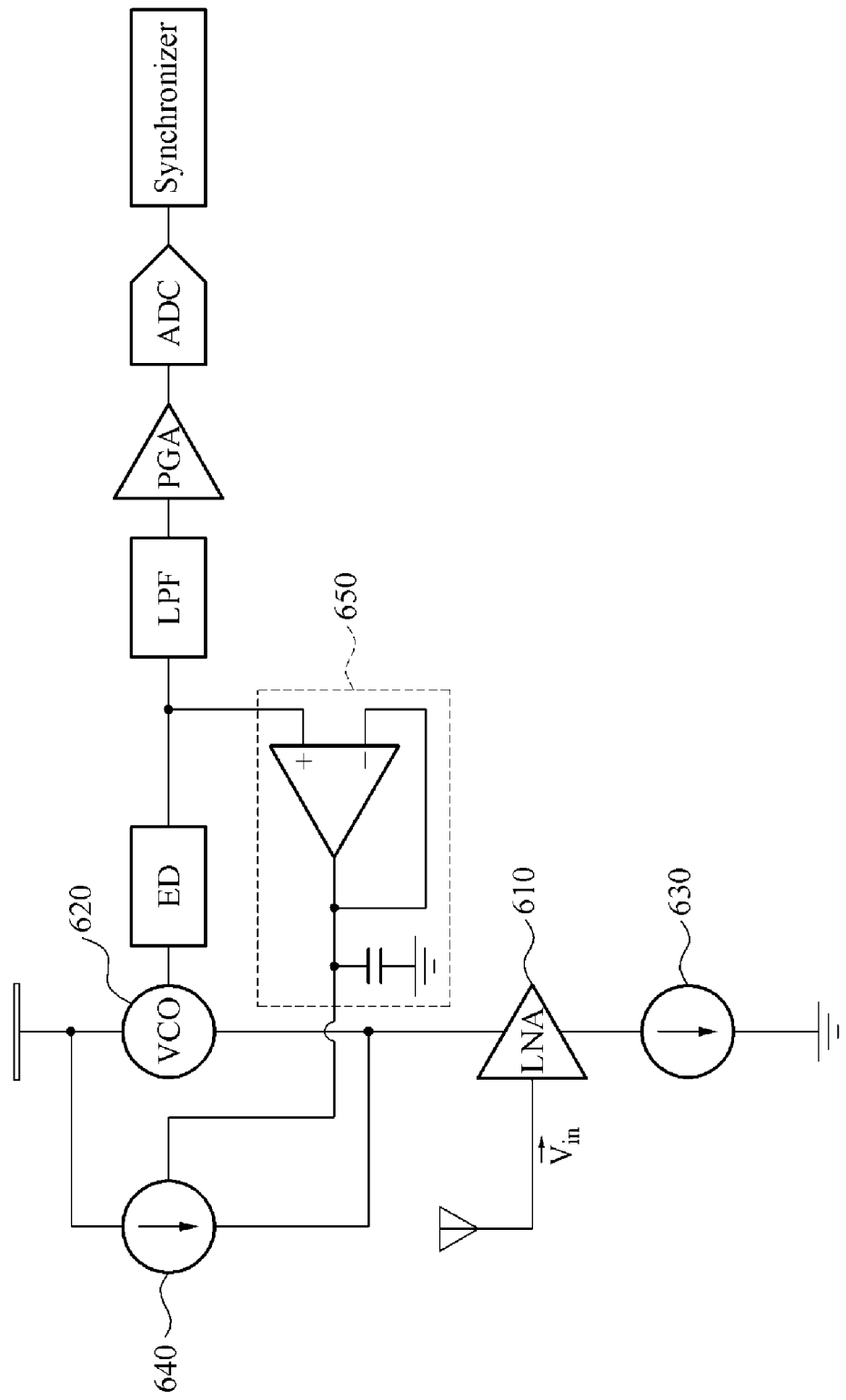
FIG. 6 is a block diagram illustrating a receiver portion of a receiver apparatus in accordance with an embodiment.

FIG. 6 is a block diagram illustrating a receiver portion of a receiver apparatus in accordance with an embodiment. The receiver includes a low noise amplifier (LNA) 610 and a voltage controlled oscillator (VCO) 620. The receiver also includes a first current source 630, a bleeding current source 640, and an automatic gain controller (AGC) 650. Some receiver components illustrated in FIG. 6 may have similar structure and characteristics to those described above with reference to FIG. 1. For ease of description, and to avoid redundancy, descriptions of such components may be omitted below.

As shown in FIG. 6, LNA 610 and the VCO 620 share the first current source 630. The LNA 610 and the VCO 620 may be stacked in a block, and thereby may be disposed in a same power transmission path. If this structure is used, the LNA 610 may use the VCO 620 as a load such that a current used in the VCO 620 may also be used in the LNA 610. For example, a first current generated by the first current source 630 may be used by the VCO 620 and may also be used by the LNA 610.

The receiver further includes the bleeding current source 640 configured to supply an additional current to the LNA 610. The bleeding current source 640 may generate the current used by the VCO 620 and a bleeding current to be supplied to the LNA 610. That is, the bleeding current source 640 may supply the current and the bleeding current to the LNA 610. For example, the bleeding current source 640 may generate or set the bleeding current based on a difference between a total current to be supplied to the LNA 610 and a total current to be supplied to the VCO 620.

The receiver apparatus further includes the AGC 650 configured to maintain a predetermined output signal intensity even when a reception signal intensity is changed. The AGC 650 may control a magnitude of a current to be generated by the first current source 630 and/or the bleeding current source 640 by sensing a signal intensity based on a signal generated after an output signal of an energy detector (ED) is generated. For example, the AGC 650 may adjust a magnitude of a bleeding current such that a magnitude of a total current to be supplied to the LNA 610 may also be adjusted. In this configuration, the AGC 650 may control a current flowing to the LNA 610 and the VCO 620.

Figure 7:
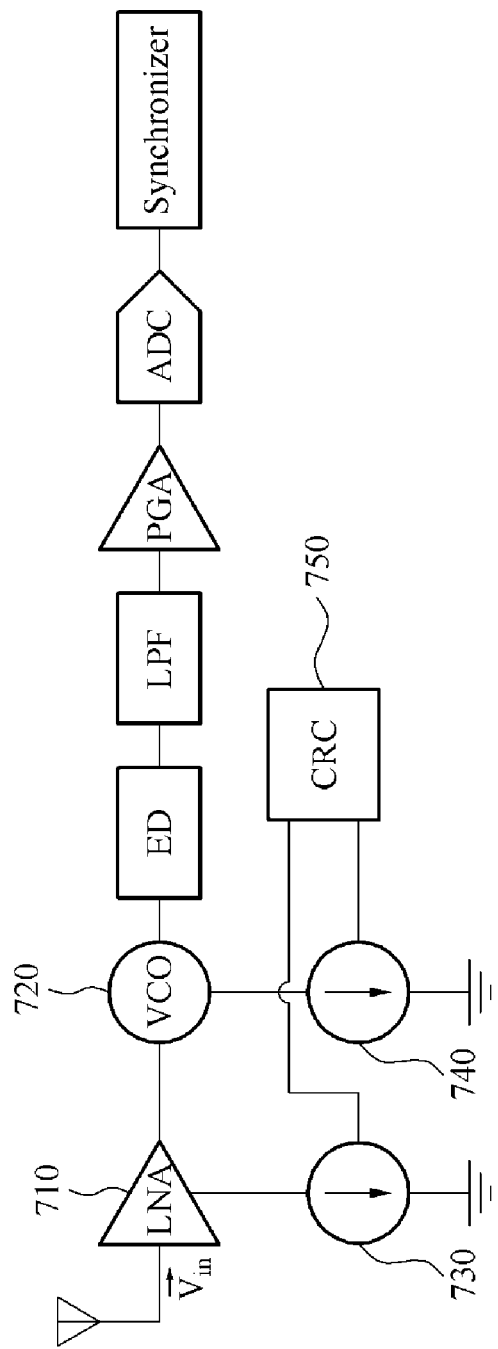
FIG. 7 is a block diagram illustrating a receiver portion of a receiver apparatus in accordance with an embodiment.

FIG. 7 is a block diagram illustrating a receiver portion of a receiver apparatus in accordance with an embodiment. The receiver includes a low noise amplifier (LNA) 710 and a voltage controlled oscillator (VCO) 720. The receiver also includes a first current source 730, a second current source 740, and a current ratio controller (CRC) 750. Some receiver components illustrated in FIG. 7 may have similar structure and characteristics to those described above with reference to FIG. 1. For ease of description, and to avoid redundancy, descriptions of such components may be omitted below.

The receiver includes the first current source 730 configured to supply a current to the LNA 710 and the second current source 740 to supply a current to the VCO 720. As described above with reference to Equation 2 and Equation 3, for example, a frequency selectivity of the receiver apparatus may be determined by a ratio of a current flowing in/through the LNA 710 to a current flowing in/through the VCO 720. Thus, the CRC 750 may control the ratio of the current flowing in the LNA 710 and the current flowing in the VCO 720, thereby increasing the frequency selectivity of the receiver.

Examples of illustrated hardware components include controllers, sensors, generators, drivers, and any other electronic components known to one of ordinary skill in the art after full understanding of the present disclosure. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art, after full understanding of the present disclosure, that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art, after full understanding of the present disclosure, that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A receiver, comprising:
    a low noise amplifier (LNA) configured to amplify an input radio frequency (RF) signal using a first current supplied by a first current source;
    a voltage controlled oscillator (VCO) configured to apply an oscillation frequency to the amplified input RF signal by generating an oscillation signal using the first current, wherein the LNA and the VCO are configured to share the first current from the first current source, and wherein the VCO comprises an LC resonator that is used to generate the oscillation signal;
    a bleeding current source configured to generate a second current to be supplied to the LNA to amplify the input RF signal; and
    a quench waveform controller configured to generate a first quench signal to control a switch electrically connected in parallel with the LC resonator and to generate a second quench signal, where the receiver is configured to apply the second quench signal to the bleeding current source.

2. The receiver of claim 1, wherein the LNA uses the VCO as a load.

3. The receiver of claim 1, wherein the receiver is a super-regenerative receiver.

4. The receiver of claim 1, wherein a total current supplied to the LNA is a sum of the first current and the second current.

5. The receiver of claim 1, further comprising:
    an energy detector (ED) configured to detect an envelope for a signal resulting from the applying of the oscillation frequency to the amplified input RF signal; and
    an automatic gain controller (AGC) configured to control a magnitude of the second current based on the detected envelope.

6. The receiver of claim 1, further comprising:
    a current ratio controller (CRC) configured to control a ratio of a total current supplied to the VCO and a total current supplied to the LNA that are dependent on the first current.

7. The receiver of claim 1, wherein the VCO comprises, the LC resonator comprising a first inductor and a first capacitor; and
    a first transistor and a second transistor, corresponding to complementary transistors, configured to perform the applying of the oscillation frequency to the amplified input RF signal.

8. The receiver of claim 7, wherein the first transistor is a p-type metal-oxide-semiconductor field-effect transistor (p-MOSFET) and the second transistor is an n-type metal-oxide-semiconductor field-effect transistor (n-MOSFET).

9. The receiver of claim 7, wherein:
    a drain node of the first transistor is electrically connected to a first end of the LC resonator;

a gate node of the first transistor electrically corresponds to a first output node of the VCO;

a drain node of the second transistor is electrically connected to a second end of the LC resonator; and a gate node of the second transistor electrically corresponds to a second output node of the VCO.

10. The receiver of claim 7, wherein a source node of either of the first transistor or the second transistor is electrically provided results of the amplifying of the input RF signal by the LNA.

11. The receiver of claim 7, wherein the VCO further comprises a switch electrically connected in parallel to the LC resonator to implement super-regeneration in the receiver.

12. The receiver of claim 7, further comprising:
a second inductor;
a second capacitor;
a third transistor of a same transistor type as the second transistor; and
a fourth transistor of a same transistor type as the first transistor, wherein:
  a source node of the first transistor is electrically connected to a first end of the second inductor and a first end of the second capacitor;
  a source node of the second transistor is electrically connected to a second end of the second capacitor, a drain node of the third transistor, and a drain node of the fourth transistor; and
  a source node of the fourth transistor is electrically connected to a voltage source.

13. A receiver, comprising:
a voltage controlled oscillator (VCO) configured to generate a signal, the signal having an oscillation frequency, using a first current;
a low noise amplifier (LNA) configured to amplify an input signal using a second current;
a current ratio controller (CRC) configured to control a ratio of the first current and the second current; and
a bleeding current source configured to generate a bleeding current,
wherein the receiver is configured so the second current is a sum of the first current and the bleeding current.

14. The receiver of claim 13, further comprising:
a first current source configured to generate the first current,
wherein the receiver is configured so the second current results from interaction of the first current and another current from another current source.

15. The receiver of claim 13, wherein the LNA uses the VCO as a load.

16. The receiver of claim 13, further comprising:
an energy detector (ED) configured to detect an envelope for a signal resulting from the applying of the oscillation frequency to the amplified input signal; and
an automatic gain controller (AGC) configured to control a magnitude of the second current based on the detected envelope.

* * * * *